US012701680B2

(12) United States Patent
Kohvakka et al.

(10) Patent No.: US 12,701,680 B2
(45) Date of Patent: Aug. 4, 2026

(54) AUTOMATION DEVICE FOR AN ELECTRIC DRIVE DEVICE AND AN ELECTRIC DRIVE DEVICE

(71) Applicant: ABB Schweiz AG, Baden (CH)

(72) Inventors: Mikko Kohvakka, Helsinki (FI); Kimmo Ollikainen, Helsinki (FI)

(73) Assignee: ABB SCHWEIZ AG, Baden (CH)

( * ) Notice: Subject to any disclaimer, the term of this patent is extended or adjusted under 35 U.S.C. 154(b) by 218 days.

(21) Appl. No.: 18/436,548

(22) Filed: Feb. 8, 2024

(65) Prior Publication Data

US 2024/0276681 A1 Aug. 15, 2024

(30) Foreign Application Priority Data

Feb. 9, 2023 (EP) ..................................... 23155780

(51) Int. Cl.
*H05K 7/20* (2006.01)
*H05K 7/14* (2006.01)

(52) U.S. Cl.
CPC ........... *H05K 7/20854* (2013.01); *H05K 7/14* (2013.01)

(58) Field of Classification Search
CPC ........... H05K 7/20854; H05K 7/20863; H05K 7/20845; H05K 7/2089; H05K 7/209; H05K 7/20909; H05K 7/20918; H05K 7/14
See application file for complete search history.

(56) References Cited

U.S. PATENT DOCUMENTS 5,513,071 A * 4/1996 LaViolette ......... H05K 7/20545
257/722
6,313,399 B1 * 11/2001 Suntio ................ H05K 7/20518
174/16.3

7,198,094 B2 * 4/2007 Barsun ...................... F28F 3/02
165/104.34
10,080,311 B1 * 9/2018 Musiol ..................... H05K 7/14
10,433,456 B2 * 10/2019 Holma ................... H05K 7/186
(Continued)

FOREIGN PATENT DOCUMENTS

CN 210986861 U 7/2020
JP S53107662 A 9/1978

OTHER PUBLICATIONS

European Search Report; Application No. EP 23 15 5780; Completed: Jun. 27, 2023; 3 Pages.

*Primary Examiner* — Jayprakash N Gandhi
*Assistant Examiner* — Matthew Sinclair Muir
(74) *Attorney, Agent, or Firm* — Greenberg Traurig, LLP

(57) ABSTRACT

A field of electric drive devices, such as electric drive devices for industrial applications, and automation devices within electric drive device installations, and more particularly to an automation device for an electric drive device and an electric drive device. The automation device according to the present invention, is arranged for an electric drive device, in which an enclosure of the automation device includes an at least one cockled side face including a multitude of curved heat sink fins along the cockled side face extending from a first end side of the automation device to a second end side of the automation device, the first end side and the second end side being neighboring end sides, the first end side joining the second end side. With the help of the solution according to the present invention, airflow in an electric drive device cabinet installation is directed to areas, where airflow is otherwise blocked.

20 Claims, 8 Drawing Sheets

(56)        References Cited

U.S. PATENT DOCUMENTS

| | | | |
|---|---|---|---|
| 12,284,787 B2 * | 4/2025 | Daminger .......... | H05K 7/20409 |
| 2013/0258564 A1 * | 10/2013 | Jackson .................. | G06F 30/39 |
| | | | 361/679.01 |
| 2015/0090435 A1 * | 4/2015 | Xia .......................... | F28F 3/00 |
| | | | 165/185 |
| 2018/0295743 A1 * | 10/2018 | Holma .............. | H05K 7/20563 |
| 2021/0176899 A1 * | 6/2021 | Krippner ............ | H05K 7/20918 |

* cited by examiner

AIR FLOW

AUTOMATION DEVICE FOR AN ELECTRIC DRIVE DEVICE AND AN ELECTRIC DRIVE DEVICE

TECHNICAL FIELD

The present invention relates to the field of electric drive devices, such as electric drive devices for industrial applications, and automation devices within electric drive device installations, and more particularly to an automation device for an electric drive device and an electric drive device.

BACKGROUND

Electric drive devices are widely used for industrial applications, e.g. for providing and controlling electrical power and energy to various public and industrial applications as well as for driving and controlling various public and industrial applications. These applications include devices for transport vehicle engines, different process and manufacturing technological devices, and devices in energy industry as well as industrial electric drives. Electric drive devices may also be referred to as power electronic devices as they typically include a number of power electronic components.

Within electric drive devices, industrial electric drives are used for various applications, such as transport vehicle engines, different process and manufacturing technological devices and in energy industry. As regards transport devices, electric drives may be used in underground railway service or shipping service, for example. In process and manufacturing technology electric drives may be used e.g. in conveyors, mixers or in paper machines, for instance. In energy industry, electric drives may be used in turbines of wind power industry or in solar power industry, for example.

Typically, in electric drive device cabinet installations the complexity and power consumption of cabinet installed automation devices is increasing that causes new challenges for thermal management. In typical electric drive device cabinet installations, the space arranged for an automation device is very limited. As the complexity and requirements of automation devices are continuously increasing, thermal design of the automation devices becomes challenging.

Furthermore, in typical electric drive device cabinet installations there typically is space able ducts and other devices which can partially block the air flow to the automation device, which reduces cooling efficiency.

In the following, prior art will be described with reference to the accompanying figures, of which:

FIG. 1 illustrates a front view of an exemplary electric drive device cabinet installation according to the prior art without a cabinet door.

FIG. 2 illustrates a partial side view of another exemplary electric drive device cabinet installation according to the prior art.

FIG. 1 illustrates a front view of an exemplary electric drive device cabinet installation according to the prior art without a cabinet door. The presented exemplary electric drive device cabinet 1 according to the prior art comprises installation devices 11-17 such as switches 11, connector modules 12-14 and LED indicator modules 15-17. In FIG. 1 only a portion of installation devices 11-17 of an electric drive device cabinet 1 installation are illustrated as an example. The exemplary electric drive device cabinet 1 according to the prior art also comprises cable ducts 30, 35. In FIG. 1 the cables of the electric drive device cabinet installation are not shown.

The presented exemplary electric drive device cabinet 1 according to the prior art also comprises an automation device 20. Automation device 20 is mounted in a DIN rail (DIN, Deutsches Institut für Normung) close to other modules or devices. Said automation device 20 is installed on top of a cable duct 30.

As the cooling airflow in the electric drive device cabinet 1 flows from the bottom to the top of the in the electric drive device cabinet 1 the cable duct 30 below the automation device 20 is partially blocking the cooling airflow from the automation device 20. Consequently, an adequate cooling of the automation device 20 in said electric drive device cabinet 1 installation is therefore not provided.

FIG. 2 illustrates a partial side view of another exemplary electric drive device cabinet installation according to the prior art. In FIG. 2 only a cabinet back wall 2 and a cabinet door 3 of the presented electric drive device cabinet are shown. Also, in FIG. 2 only a cable duct 30 and an automation device 20 according to the prior art are illustrated. In FIG. 2 the other installation devices and cable ducts of the electric drive device cabinet installation are not shown. Likewise, in FIG. 2 the cables of the electric drive device cabinet installation are not shown.

FIG. 2 presents an example of installation in which said automation device 20 is mounted to a DIN rail 4 arranged in the cabinet back wall 2. Said automation device 20 is installed on top of said cable duct 30. In the electric drive device cabinet installation, the cooling is typically arranged by natural convection or with fans, which both cause airflow from bottom to top, the airflow indicated with an arrow and a reference number 5.

As the cooling airflow in the electric drive device cabinet 1 flows from the bottom to the top of the in the electric drive device cabinet 1 the cable duct 30 is partially blocking the cooling airflow from the automation device 20. The problem of the prior art electric drive device cabinet design is the blocking effect of airflow by a partially blocking device, in FIG. 2 said cable duct 30, which prevents uniform airflow to the automation device 20.

As illustrated in FIG. 2, certain areas of the the automation device 20 lack of adequate airflow and cooling. In the prior art electric drive device cabinet installation the airflow is efficient only in the front part of the automation device 20 the area of said front part depicted with a dashed line and a reference number 21 in FIG. 2.

In the prior art electric drive device cabinet installation, a substantial part of the airflow to the back part of the automation device 20 is blocked by the cable duct 30. In FIG. 2 the area of said back part with inefficient cooling is depicted with a dashed line and a reference number 22. Consequently, adequate cooling of the automation device 20 in said electric drive device cabinet 1 installation is therefore not provided. The presented thermal design problem is even more difficult when other devices are horizontally very close to each other.

The problem with prior art electric drive device cabinet installations and with prior art automation devices 20 is simply adequate cooling of the automation devices. The complexity and power consumption of cabinet installed automation devices is increasing that causes new challenges for thermal management. In prior art electric drive device cabinet installations, the cable ducts and other devices partially block air flow to the automation devices, which reduces cooling efficiency.

Automation devices are typically installed in cabinets, where the space is very limited. As the complexity and requirements of automation devices are continuously increasing, thermal design of the automation devices becomes even more challenging. New developments and requirements, such as digitalization with cloud connectivity and predictive maintenance functions have increased the amount of exchanged data and data processing requirements. New properties and functionalities, such as data analytics, data encryption and high-speed cloud communication generate even more heat in the automation devices, and more efficient cooling is desperately needed.

One possibility to improve cooling of the automation devices is to use an extra fan. However, but an extra fan reduces the reliability of the electric drive device cabinet installation due to lower reliability and shorter service interval.

Consequently, there is clearly a need and demand for an automation device for an electric drive device and for an electric drive device that would provide an improved cooling of an automation device in an electric drive device cabinet installation.

SUMMARY

The object of the invention is to introduce an automation device for an electric drive device and to introduce an electric drive device, which provides an improved cooling of an automation device in an electric drive device cabinet installation. Advantageous embodiments are furthermore presented.

It is brought forward a new automation device for an electric drive device, an enclosure of said automation device comprising an at least one cockled side face comprising a multitude of curved heat sink fins along said cockled side face extending from a first end side of the automation device to a second end side of the automation device, said first end side and said second end side being neighboring end sides, said first end side joining said second end side. Hereby, one or more of the above-mentioned advantages and/or objectives are achieved. These advantages and/or objectives are further facilitated with the additional preferred features and/or steps described in the following.

In a preferred embodiment, said enclosure is made from aluminium.

In a preferred embodiment, said enclosure is made from a material having a good thermal conductivity, e.g. from a material comprising aluminium, aluminium alloy, magnesium, copper, brass, plastic, polymer, polymer alloy or synthetic resin.

In a preferred embodiment, said said multitude of curved heat sink fins are arranged on both cockled side faces of said enclosure.

In a preferred embodiment, said automation device is mounted to a DIN rail arranged in a cabinet back wall of an electric drive device.

In a preferred embodiment, said automation device is mounted to a cabinet back wall of an electric drive device, and wherein said curved heat sink fins do not extend all the way to the back of said automation device.

In a preferred embodiment, the angle of incidence of said curved heat sink fins is between 0 degrees and 30 degrees.

In a preferred embodiment, the angle of incidence of said curved heat sink fins is between 10 degrees and 15 degrees.

In a preferred embodiment, the turning angle of said curved heat sink fins is between 60 degrees and 90 degrees.

In a preferred embodiment, the turning angle of said curved heat sink fins is between 75 degrees and 85 degrees.

In a preferred embodiment, said automation device comprises a front panel frame arranged in the front of said automation device, and wherein said at least one cockled side face comprises a small space between said curved heat sink fins and said front panel frame.

In a preferred embodiment, said automation device comprises a front panel frame arranged in the front of said automation device, and wherein said the curved heat sink fins extend all the way to said front panel frame.

In a preferred embodiment, said automation device comprises a front part set in between two side faces, said two side faces extend all the way to the front of said automation device.

Furthermore, it is brought forward a new electric drive device, said electric drive device comprising an automation device, said automation device comprising an enclosure and a multitude of curved heat sink fins arranged on at least one side face of said enclosure. Hereby, one or more of the above-mentioned advantages and/or objectives are achieved. These advantages and/or objectives are further facilitated with the additional preferred features and/or steps described in the following.

In a preferred embodiment, said electric drive device comprises a frequency converter.

BRIEF DESCRIPTION OF THE DRAWINGS

In the following, the present invention will be described in more detail by way of example and with reference to the attached drawings, in which.

The foregoing aspects, features and advantages of the invention will be apparent from the drawings and the detailed description related thereto.

Figure 1:
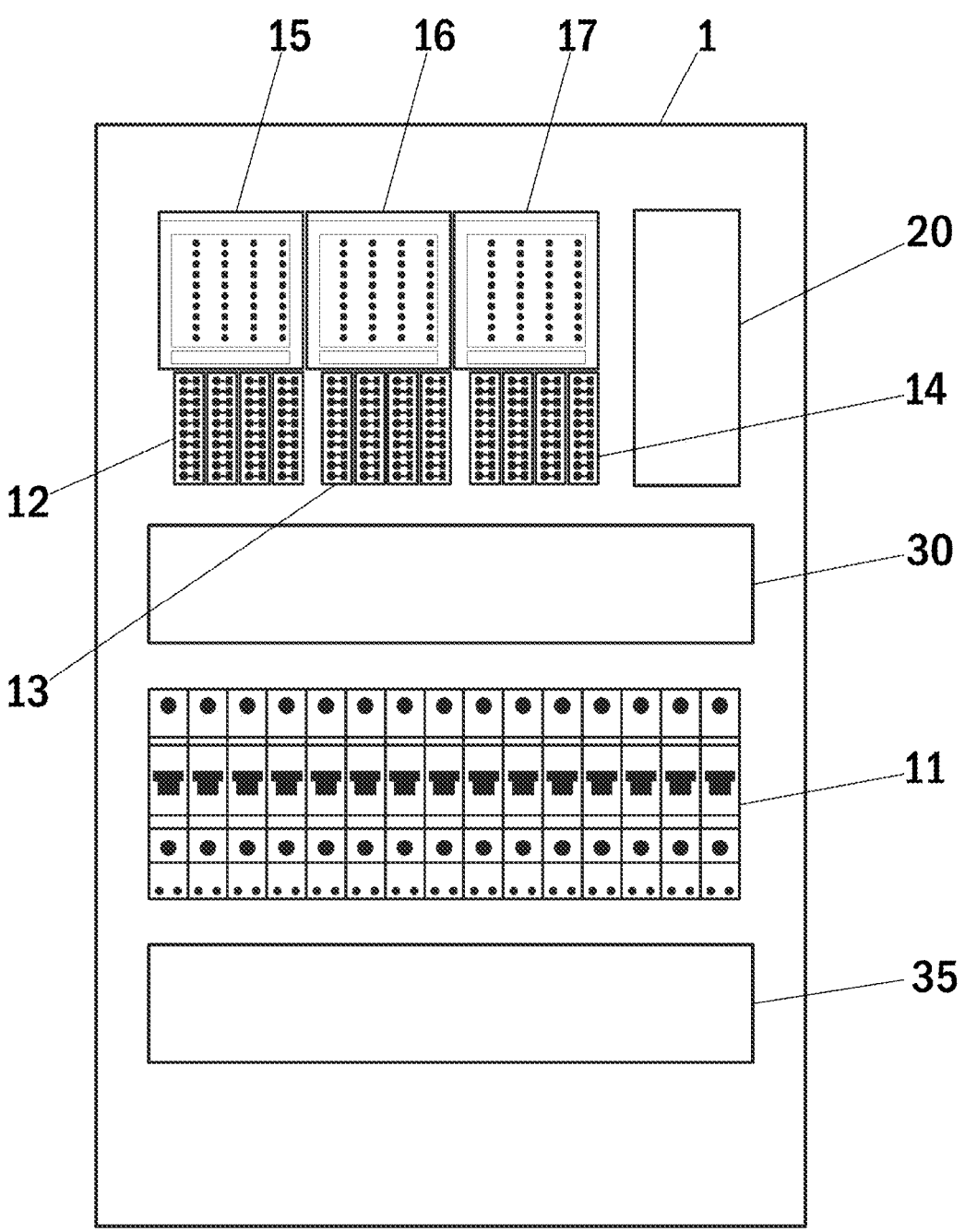
FIG. 1 illustrates a front view of an exemplary electric drive device cabinet installation according to the prior art without a cabinet door.
Figure 2:
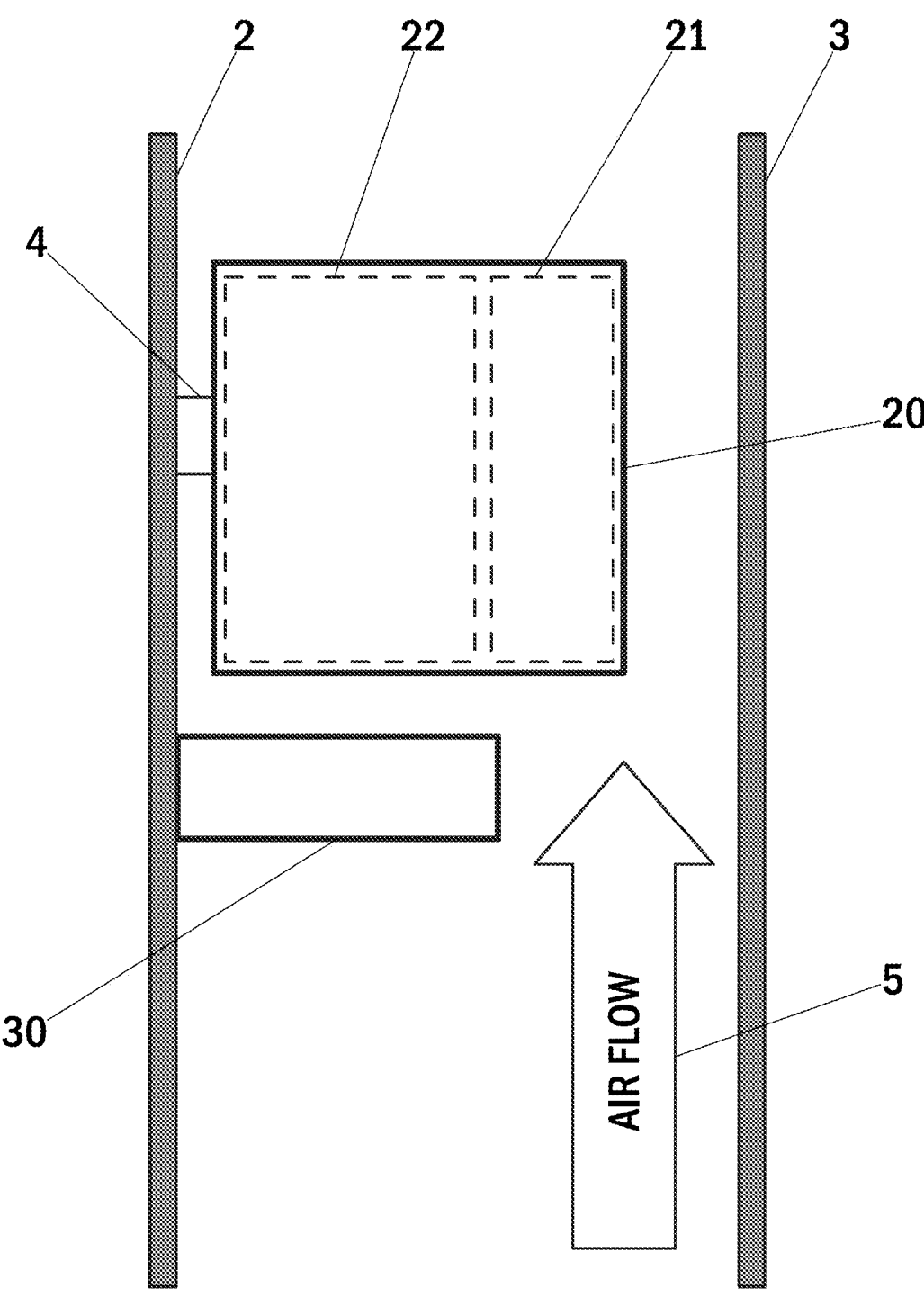
FIG. 2 illustrates a partial side view of another exemplary electric drive device cabinet installation according to the prior art.

The prior art drawings of FIGS. 1 to 2 have been presented earlier. In the following, the invention will be described in greater detail by means of preferred embodiments with reference to the accompanying drawings of FIGS. 3 to 8.

DETAILED DESCRIPTION

The automation device according to one embodiment of the present invention is arranged for an electric drive device and comprises an enclosure and a multitude of curved heat sink fins arranged on at least one cockled side face of said enclosure.

Figure 3:
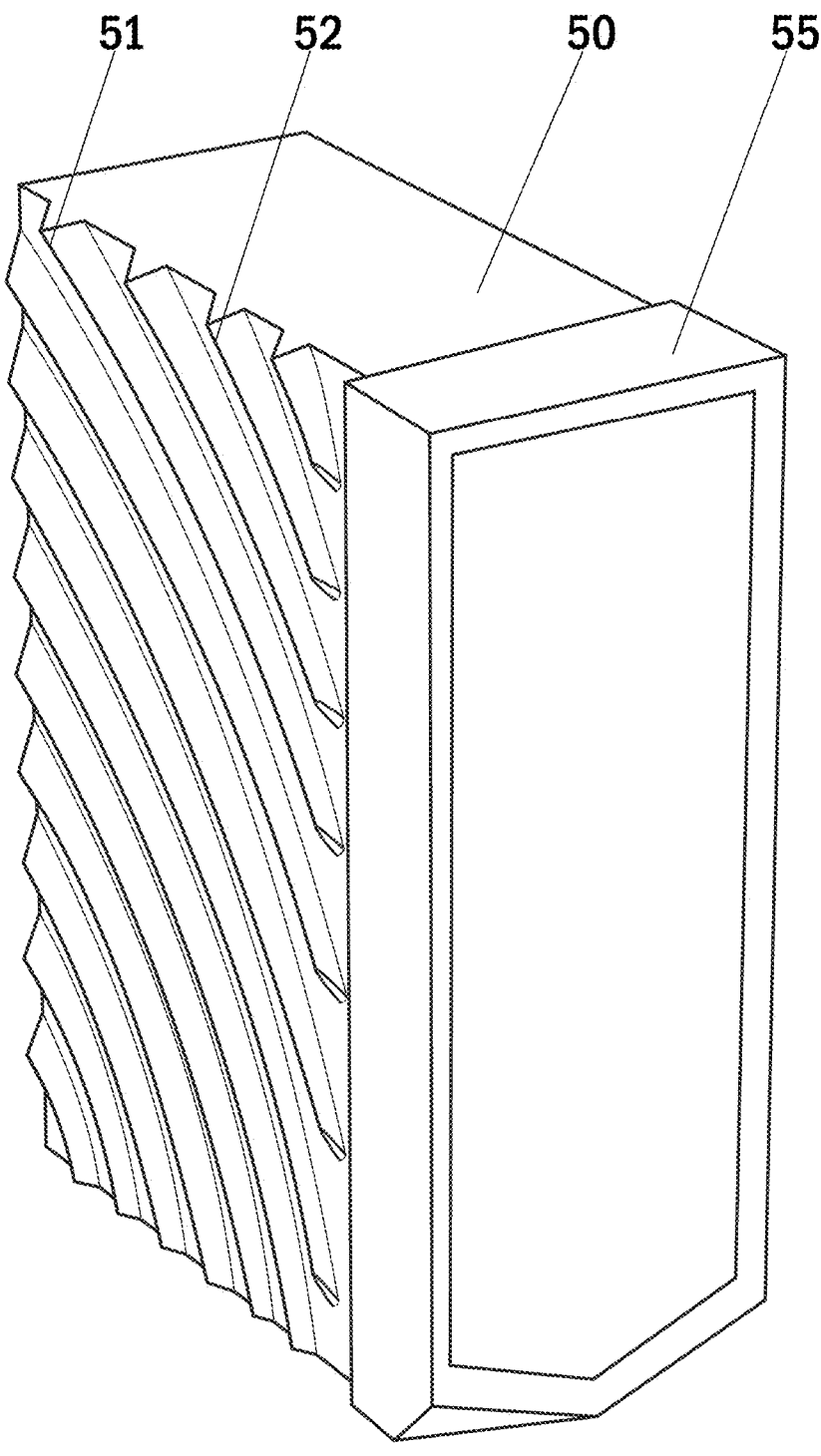
FIG. 3 illustrates a perspective front view of an embodiment of an an automation device according to the present invention.

FIG. 3 illustrates a perspective front view of an embodiment of an an automation device according to the present invention. The automation device 50 presented in FIG. 3 is designed for installation in an electric drive device cabinet. In the presented embodiment the automation device 50 comprises a front panel frame 55 arranged in the front of said automation device 50.

In the presented embodiment the enclosure of the automation device 50 comprises a multitude of curved heat sink fins 51, 52 arranged on at least one cockled side face of the enclosure of said automation device 50. The enclosure of the automation device 50 acts as an external passive heat sink, i.e. thermal energy is conducted from the heated components of said automation device 50 to the thermally conducting enclosure of the automation device 50, which acts as a heat sink.

The enclosure of the automation device 50 may be made from aluminium or from any other material having a good thermal conductivity, e.g. from a material comprising aluminium, aluminium alloy, magnesium, copper, brass, plastic, polymer, polymer alloy or synthetic resin.

In the presented embodiment the curved heat sink fins 51, 52 of the enclosure increase the thermal efficiency, i.e. cooling efficiency, of the automation device 50. The curved heat sink fins 51, 52 direct the airflow from the front of the automation device 50 towards the back of the automation device 50 thereby efficiently cooling a larger portion of said enclosure of the automation device 50.

In the presented embodiment of FIG. 3 the curved heat sink fins 51, 52 are arranged on one cockled side face of the enclosure of said automation device 50. In an alternative embodiment the curved heat sink fins 51, 52 are arranged on two cockled side faces of the enclosure of said automation device 50. In the presented embodiment of FIG. 3 the automation device 50 comprises a front panel frame 55 arranged in the front of said automation device 50. In an alternative embodiment the front part the automation device 50 is set in between two side faces of the enclosure so that said faces extend all the way to the front of said automation device 50.

Figure 4:
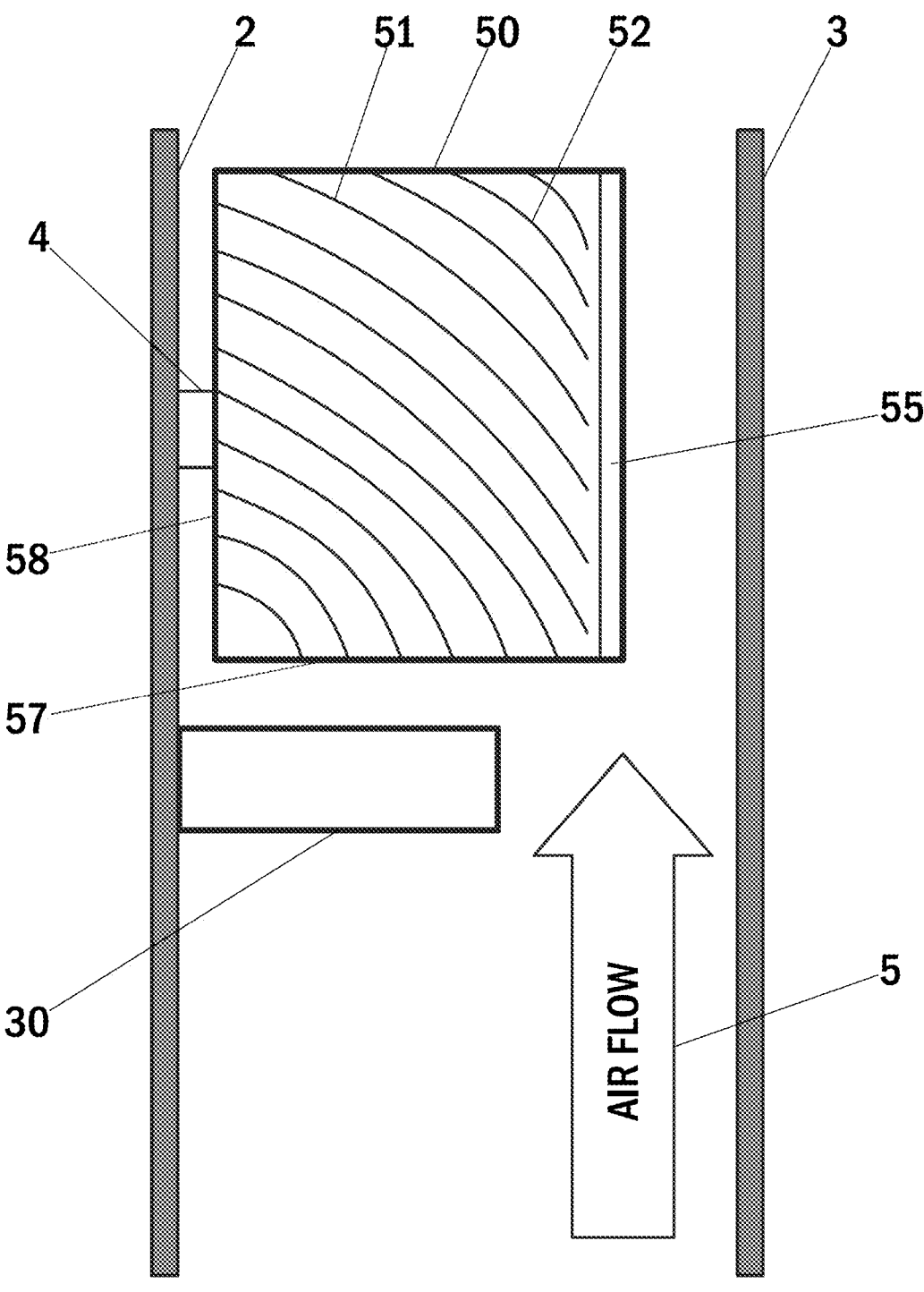
FIG. 4 illustrates a partial side view of one embodiment of an electric drive device cabinet installation according to the present invention.

FIG. 4 illustrates a partial side view of one embodiment of an electric drive device cabinet installation according to the present invention. In FIG. 4 only a cabinet back wall 2 and a cabinet door 3 of the presented electric drive device cabinet are shown. Also, in the presented embodiment a blocking device 30, such as e.g. a cable duct 30, and an automation device 50 are illustrated. The automation device 50 according to the presented embodiment comprises a front panel frame 55 arranged in the front of said automation device 50. In FIG. 4 the other installation devices and cable ducts of the electric drive device cabinet installation are not shown. Likewise, in FIG. 4 the cables of the electric drive device cabinet installation are not shown.

FIG. 4 presents an example of installation in which said automation device 50 is mounted to a DIN rail 4 arranged in the cabinet back wall 2. Said automation device 50 is installed on top of said blocking device 30. In the electric drive device cabinet installation, the cooling may be arranged by natural convection or with fans both causing airflow from bottom to top, the airflow indicated with an arrow and a reference number 5.

As the cooling airflow 5 in the electric drive device cabinet 1 flows from the bottom to the top of the in the electric drive device cabinet 1 the blocking device 30 is partially blocking the cooling airflow 5 from the automation device 50 according to the presented embodiment. The problem of the prior art electric drive device cabinet design is the blocking effect of airflow by a partially blocking device 30, in FIG. 4 said cable duct 30, which prevents uniform airflow to the automation device 20.

In the presented embodiment the enclosure of the automation device 50 comprises a multitude of curved heat sink fins 51, 52 arranged on at least one cockled side face of the enclosure of said automation device 50, said heat sink fins 51, 52 along said cockled side face extending from a first end side 57 of the automation device 50 to a second end side 58 of the automation device 50, said first end side 57 and said second end side 58 being neighboring end sides 57, 58, said first end side 57 joining said second end side 58. Said at least one cockled side face of the enclosure of said automation device 50 joins both of said first end side 57 and said second end side 58. The enclosure of the automation device 50 acts as an external passive heat sink, i.e. thermal energy is conducted to the thermally conducting enclosure of the automation device 50, which acts as a heat sink. The enclosure of the automation device 50 may be made from aluminium or from any other material having a good thermal conductivity, e.g. from a material comprising aluminium, aluminium alloy, magnesium, copper, brass, plastic, polymer, polymer alloy or synthetic resin.

In the presented embodiment there is a small space arranged on said at least one cockled side face between said curved heat sink fins 51, 52 and said front panel frame 55 of the automation device 50. So in the presented embodiment the curved heat sink fins 51, 52 of the enclosure do not extend all the way to the front panel frame 55 of the automation device 50. Said curved heat sink fins 51, 52 increase the thermal efficiency, i.e. cooling efficiency, of the automation device 50. Said heat sink fins 51, 52 direct the airflow from the front of the automation device 50 towards the back of the automation device 50 thereby efficiently cooling a larger portion of said enclosure of the automation device 50.

Said curved heat sink fins 51, 52 may be arranged on one or both cockled side faces of the enclosure of said automation device 50. In the presented embodiment of FIG. 4 the automation device 50 comprises a front panel frame 55 arranged in the front of said automation device 50. In an alternative embodiment the front part the automation device 50 is set in between two side faces of the enclosure so that said two side faces extend all the way to the front of said automation device 50.

Figure 5:
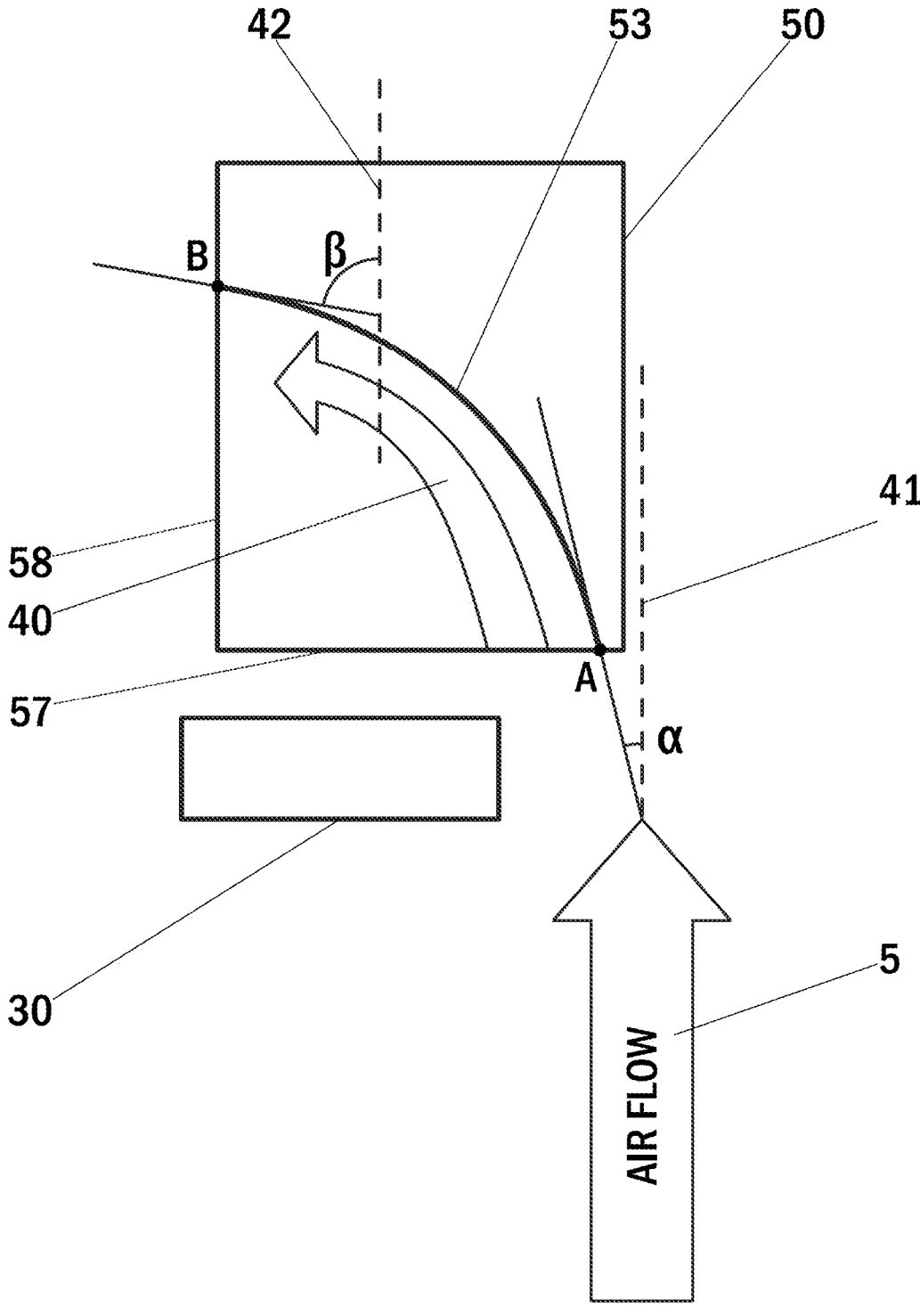
FIG. 5 illustrates the operation principle of one embodiment of an automation device for an electric drive device according to the present invention.

FIG. 5 illustrates the operation principle of one embodiment of an automation device for an electric drive device according to the present invention. In FIG. 5 an automation device is indicated with a reference number 50 and the airflow inside an electric drive device cabinet is indicated with an arrow and a reference number 5. In the presented illustration a blocking device 30, such as e.g. a cable duct 30, partially blocking the cooling airflow from the automation device 50 is illustrated.

In the presented embodiment the enclosure of the automation device 50 comprises a multitude of curved heat sink fins 53 arranged on at least one cockled side face of the enclosure of said automation device 50, said heat sink fins 53 along said cockled side face extending from a first end side 57 of the automation device 50 to a second end side 58 of the automation device 50, said first end side 57 and said second end side 58 being neighboring end sides 57, 58, said first end side 57 joining said second end side 58. Said at least one cockled side face of the enclosure of said automation device 50 joins both of said first end side 57 and said second end side 58. Said multitude of curved heat sink fins 53 direct the airflow from the front of the automation device 50 towards the back of the automation device 50 thereby efficiently cooling a larger portion of said enclosure of the automation device 50. In FIG. 5 only one curved heat sink fin 53 of said multitude of curved heat sink fins 53 is shown.

In FIG. 5 the directed airflow is indicated with an arrow and a reference number 40. In FIG. 5 there are also depicted two angles for said multitude of curved heat sink fins 53, namely an angle of incidence a and a turning angle β.

When referring to the term "angle of incidence", in this application it is meant to refer to an angle defined on a plane of a side face of the enclosure of said automation device 50 as the angle α between a line parallel to the front side 56 of the automation device 50 and the inclination of the heatsink fin 53 at said first end side 57 of the automation device 50. In the embodiment of FIG. 5 the automation device 50 is installed upright and an upright line 41 parallel to the front side 56 of the automation device 50 is shown as a dashed line marked with a reference number 41. As shown in FIG. 5, an airflow 5 entering from the bottom upwards meets the first end side 57 of the automation device 50 at the point A in the angle of incidence, i.e. in the angle α. In the embodiment shown on FIG. 5, the point A also indicates the point in which the entering airflow 5 meets the heatsink fin 53, i.e. at the beginning of the heatsink fin 53. The angle of incidence a is selected to be small enough to avoid turbulence and to maximize the airflow going into the area of said multitude of curved heat sink fins 53, i.e. into the heatsink area. In an embodiment of the present invention the angle of incidence a is selected to be between 0 degrees and 30 degrees (0° to) 30°. In another embodiment of the present invention the angle of incidence a is selected to be between 10 degrees and 15 degrees (10° to) 15°.

When referring to the term "turning angle", in this application it is meant to refer to an angle defined on a plane of a side face of the enclosure of said automation device 50 as the angle β between a line parallel to said second end side 58 of the automation device 50 and the inclination of the heatsink fin 53 at the second end side 58 of the automation device 50. In the embodiment of FIG. 5 the automation device 50 is installed upright and an upright line 42 parallel to the second end side 58 of the automation device 50 is shown as a dashed line marked with a reference number 42. As shown in FIG. 5, the directed airflow 40 meets the second end side 58 of the automation device 50 at the point B in the turning angle, i.e. in the angle β. In the embodiment shown on FIG. 5, the point B also indicates the point in which the directed airflow 40 leaves the heatsink fin 53, i.e. at the end of the heatsink fin 53. The turning angle β is selected to be large enough to maximize the effective airflow in the area of said multitude of curved heat sink fins 53, i.e. in the heatsink area. In an embodiment of the present invention the turning angle β is selected to be between 60 degrees and 90 degrees (60° to) 90°. In another embodiment of the present invention the turning angle β is selected to be between 75 degrees and 85 degrees (75° to) 85°.

In the presented embodiment the said multitude of curved heat sink fins 53 direct the airflow along the thermally conducting enclosure of said automation device 50. The thermal energy from said automation device 50 is conducted to the aluminium enclosure of the device, where said multitude of curved heat sink fins 53 release thermal energy to the cooling airflow along the thermally conducting enclosure.

Figure 6:
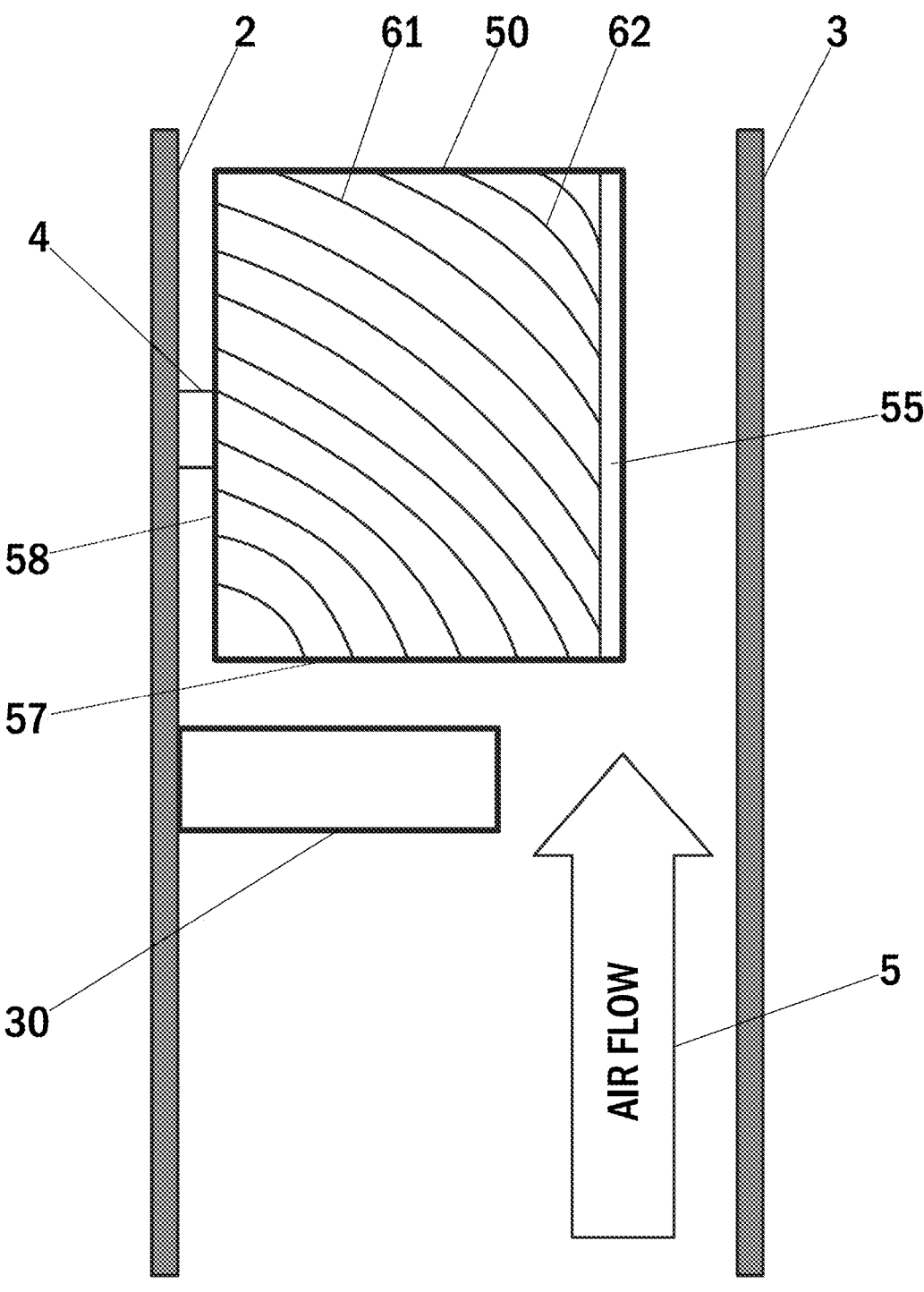
FIG. 6 illustrates a partial side view of another embodiment of an electric drive device cabinet installation according to the present invention.

FIG. 6 illustrates a partial side view of another embodiment of an electric drive device cabinet installation according to the present invention. In FIG. 6 only a cabinet back wall 2 and a cabinet door 3 of the presented electric drive device cabinet are shown. Also, in the presented another embodiment a blocking device 30, such as e.g. a cable duct 30, and an automation device 50 are illustrated. The automation device 50 according to the presented another embodiment comprises a front panel frame 55 arranged in the front of said automation device 50. In FIG. 6 the other installation devices and cable ducts of the electric drive device cabinet installation are not shown. Likewise, in FIG. 6 the cables of the electric drive device cabinet installation are not shown. FIG. 6 presents an example of installation in which said automation device 50 is mounted to a DIN rail 4 arranged in the cabinet back wall 2. Said automation device 50 is installed on top of said blocking device 30.

In the electric drive device cabinet installation, the cooling may be arranged by natural convection or with fans both causing airflow from bottom to top, the airflow indicated with an arrow and a reference number 5. As the cooling airflow 5 in the electric drive device cabinet 1 flows from the bottom to the top of the in the electric drive device cabinet 1 the blocking device 30 is partially blocking the cooling airflow 5 from the automation device 50 according to the presented another embodiment. In the presented another embodiment the enclosure of the automation device 50 comprises a multitude of curved heat sink fins 61, 62 arranged on at least one cockled side face of the enclosure of said automation device 50, said heat sink fins 61, 62 along said cockled side face extending from a first end side 57 of the automation device 50 to a second end side 58 of the automation device 50, said first end side 57 and said second end side 58 being neighboring end sides 57, 58, said first end side 57 joining said second end side 58. Said at least one cockled side face of the enclosure of said automation device 50 joins both of said first end side 57 and said second end side 58.

In the presented another embodiment the curved heat sink fins 61, 62 of the enclosure extend all the way to the front panel frame 55 of the automation device 50. Said curved heat sink fins 61, 62 may be arranged on one or both cockled side faces of the enclosure of said automation device 50. In the presented another embodiment of FIG. 6 the automation device 50 comprises a front panel frame 55 arranged in the front of said automation device 50. In an alternative embodiment the front part the automation device 50 is set in between two side faces of the enclosure so that said faces as well as said curved heat sink fins extend all the way to the front of said automation device 50.

Figure 7:
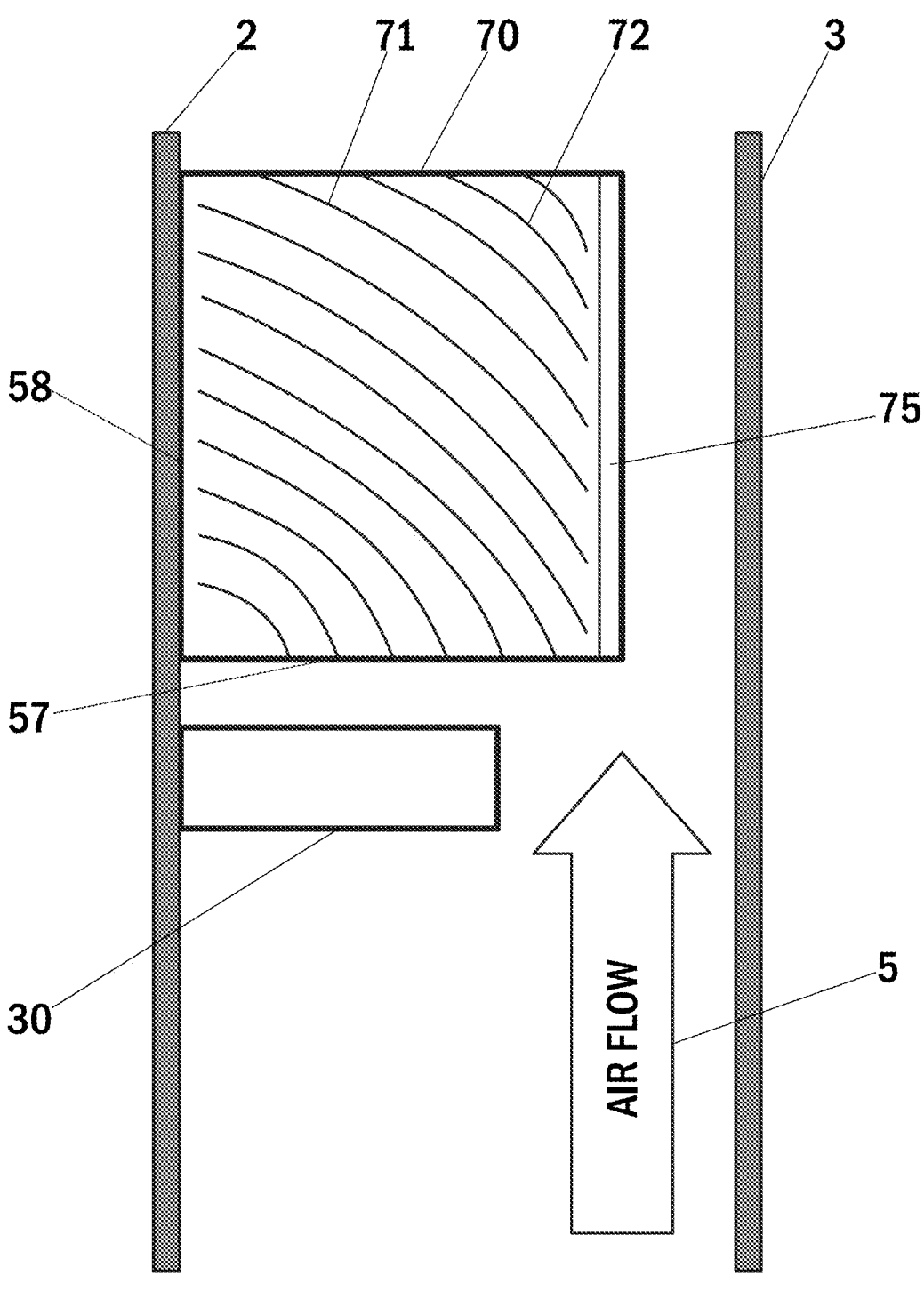
FIG. 7 illustrates a partial side view of a third embodiment of an electric drive device cabinet installation according to the present invention.

FIG. 7 illustrates a partial side view of a third embodiment of an electric drive device cabinet installation according to the present invention. In FIG. 7 only a cabinet back wall 2 and a cabinet door 3 of the presented electric drive device cabinet are shown. Also, in the presented third embodiment a blocking device 30, such as e.g. a cable duct 30, and an automation device 70 are illustrated. The automation device 70 according to the presented third embodiment comprises a front panel frame 75 arranged in the front of said automation device 70. In FIG. 7 the other installation devices and cable ducts of the electric drive device cabinet installation are not shown. Likewise, in FIG. 7 the cables of the electric drive device cabinet installation are not shown. FIG. 7 presents an example of installation in which said automation device 70 is mounted directly to the cabinet back wall 2. Said automation device 70 is installed on top of said blocking device 30.

In the electric drive device cabinet installation, the cooling may be arranged by natural convection or with fans both causing airflow from bottom to top, the airflow indicated with an arrow and a reference number 5. As the cooling airflow 5 in the electric drive device cabinet 1 flows from the bottom to the top of the in the electric drive device cabinet 1 the blocking device 30 is partially blocking the cooling airflow 5 from the automation device 70 according to the presented third embodiment.

In the presented third embodiment the enclosure of the automation device 70 comprises a multitude of curved heat sink fins 71, 72 arranged on at least one cockled side face of the enclosure of said automation device 70, said heat sink fins 71, 72 along said cockled side face extending from a first end side 57 of the automation device 70 to a second end side 58 of the automation device 70, said first end side 57 and said second end side 58 being neighboring end sides 57, 58, said first end side 57 joining said second end side 58. Said at least one cockled side face of the enclosure of said automation device 70 joins both of said first end side 57 and said second end side 58. The enclosure of the automation device 70 acts as an external passive heat sink, i.e. thermal energy is conducted to the thermally conducting enclosure of the automation device 70, which acts as a heat sink. The enclosure of the automation device 70 may be made from aluminium or from any other material having a good thermal conductivity, e.g. from a material comprising aluminium, aluminium alloy, magnesium, copper, brass, plastic, polymer, polymer alloy or synthetic resin.

In the presented third embodiment there is a small space arranged on said at least one cockled side face between said curved heat sink fins 71, 72 and said front panel frame 75 of the automation device 70. So, in the presented third embodiment the curved heat sink fins 71, 72 of the enclosure do not extend all the way to the front panel frame 75 of the automation device 70. In the presented third embodiment said curved heat sink fins 71, 72 of the enclosure do not extend all the way to the back of said automation device 70.

Said curved heat sink fins 71, 72 increase the thermal efficiency, i.e. cooling efficiency, of the automation device 70. Said heat sink fins 71, 72 direct the airflow from the front of the automation device 70 towards the back of the automation device 70 thereby efficiently cooling a larger portion of said enclosure of the automation device 70.

Said curved heat sink fins 71, 72 may be arranged on one or both cockled side faces of the enclosure of said automation device 70. In the presented third embodiment of FIG. 7 the automation device 70 comprises a front panel frame 75 arranged in the front of said automation device 70. In an alternative embodiment the front part the automation device 70 is set in between two side faces of the enclosure so that said faces extend all the way to the front of said automation device 70.

Figure 8:
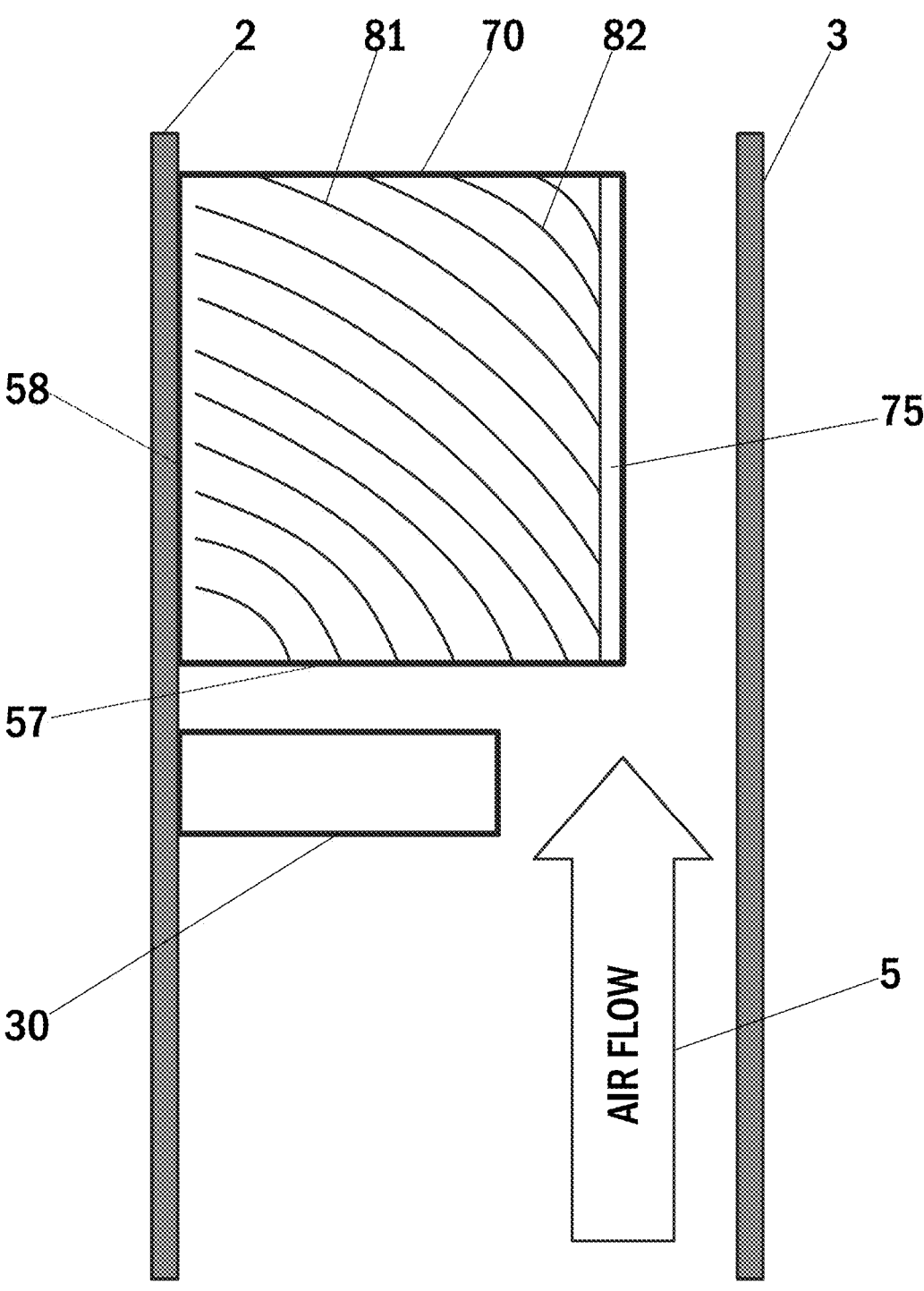
FIG. 8 illustrates a partial side view of a fourth embodiment of an electric drive device cabinet installation according to the present invention.

FIG. 8 illustrates a partial side view of a fourth embodiment of an electric drive device cabinet installation according to the present invention. In FIG. 8 only a cabinet back wall 2 and a cabinet door 3 of the presented electric drive device cabinet are shown. Also, in the presented fourth embodiment a blocking device 30, such as e.g. a cable duct 30, and an automation device 70 are illustrated. The automation device 70 according to the presented fourth embodiment comprises a front panel frame 75 arranged in the front of said automation device 70. In FIG. 8 the other installation devices and cable ducts of the electric drive device cabinet installation are not shown. Likewise, in FIG. 8 the cables of the electric drive device cabinet installation are not shown. FIG. 8 presents an example of installation in which said automation device 70 is mounted directly to the cabinet back wall 2. Said automation device 70 is installed on top of said blocking device 30.

In the electric drive device cabinet installation, the cooling may be arranged by natural convection or with fans both causing airflow from bottom to top, the airflow indicated with an arrow and a reference number 5. As the cooling airflow 5 in the electric drive device cabinet 1 flows from the bottom to the top of the in the electric drive device cabinet 1 the blocking device 30 is partially blocking the cooling airflow 5 from the automation device 70 according to the presented fourth embodiment. In the presented fourth embodiment the enclosure of the automation device 70 comprises a multitude of curved heat sink fins 81, 82 arranged on at least one cockled side face of the enclosure of said automation device 70, said heat sink fins 81, 82 along said cockled side face extending from a first end side 57 of the automation device 70 to a second end side 58 of the automation device 70, said first end side 57 and said second end side 58 being neighboring end sides 57, 58, said first end side 57 joining said second end side 58. Said at least one cockled side face of the enclosure of said automation device 70 joins both of said first end side 57 and said second end side 58.

In the presented fourth embodiment the curved heat sink fins 81, 82 of the enclosure extend all the way to the front panel frame 75 of the automation device 70. In the presented fourth embodiment said curved heat sink fins 81, 82 of the enclosure do not extend all the way to the back of said automation device 70. Said curved heat sink fins 81, 82 may be arranged on one or both cockled side faces of the enclosure of said automation device 70. In the presented fourth embodiment of FIG. 8 the automation device 70 comprises a front panel frame 75 arranged in the front of said automation device 70. In an alternative embodiment the front part the automation device 70 is set in between two side faces of the enclosure so that said faces as well as said curved heat sink fins extend all the way to the front of said automation device 70.

With the help of the solution according to the present invention airflow in an electric drive device cabinet installation is directed to areas, where airflow is otherwise blocked. In the solution according to the present invention the curved heat sink fins arranged on one or both cockled side faces of the enclosure of said automation device spread the airflow almost uniformly to the heatsink and the blocking effect of a partially blocking device is minimised.

The solution according to the present invention helps to spread airflow more evenly to the curved heat sink fins and improve thermal performance of the automation device.

The solution according to the present invention can be used for improving thermal performance of any kind of automation device, such as a control device, a communication device, a monitoring device, a connectivity device, or any other automation device.

The solution according to the present invention proposes a curved heatsink fin design that directs airflow to the areas of an automation device, where airflow is otherwise blocked. The solution according to the present invention provides an elegant, inexpensive, and effective solution without additional extra components.

It is to be understood that the above description and the accompanying Figures are only intended to teach the best way known to the inventors to make and use the invention. It will be apparent to a person skilled in the art that the inventive concept can be implemented in various ways. The above-described embodiments of the invention may thus be modified or varied, without departing from the invention, as appreciated by those skilled in the art in light of the above teachings. It is therefore to be understood that the invention and its embodiments are not limited to the examples described above but may vary within the scope of the claims and their equivalents.

The invention claimed is:

1. An automation device for an electric drive device cabinet installation having a bottom-to-top cooling airflow and a blocking device located below the automation device, wherein an enclosure of said automation device comprises a front side and at least one cockled side face, the at least one cockled side face including a multitude of curved heat sink fins along said cockled side face extending from a first end side of the enclosure to a second end side of the enclosure, said first end side and said second end side being neighboring end sides, said first end side joining said second end side, wherein each curved heat sink fin has:

a starting portion adjacent the first end side at which an angle of incidence a is measured between the inclination of the fin at the starting portion and a line parallel to the front side of the automation device; and a terminal portion adjacent the second end side at which a turning angle β is measured between the inclination of the fin at the terminal portion and a line parallel to the second end side of the automation device; and wherein the plurality of curved heat sink fins are arranged so that, when installed above said blocking device and exposed to said bottom to top cooling airflow in the cabinet, airflow is redirected from the front side toward the back of the enclosure to cool regions otherwise shadowed by the blocking device.

2. The automation device according to claim 1, wherein said enclosure is made from aluminium.

3. The automation device according to claim 1, wherein said enclosure is made from a material having a good thermal conductivity.

4. The automation device according to claim 1, wherein said multitude of curved heat sink fins are arranged on both cockled side faces of said enclosure.

5. The automation device according to claim 1, wherein said automation device is mounted to a DIN rail arranged in a cabinet back wall of the electric drive device cabinet installation.

6. The automation device according to claim 1, wherein said automation device is mounted to a cabinet back wall of the electric drive device cabinet installation.

7. The automation device according to claim 1, wherein the angle of incidence of said curved heat sink fins is between 0 degrees and 30 degrees.

8. The automation device according to claim 1, wherein the angle of incidence of said curved heat sink fins is between 10 degrees and 15 degrees.

9. The automation device according to claim 1, wherein the turning angle of said curved heat sink fins is between 60 degrees and 90 degrees.

10. The automation device according to claim 1, wherein the turning angle of said curved heat sink fins is between 75 degrees and 85 degrees.

11. The automation device according to claim 1, wherein said automation device comprises a front panel frame arranged in the front side of said enclosure, and wherein said at least one cockled side face includes a small space between said curved heat sink fins and said front panel frame.

12. The automation device according to claim 1, wherein said automation device comprises a front panel frame arranged in the front side of said enclosure, and wherein said the curved heat sink fins extend all the way to said front panel frame.

13. The automation device according to claim 1, wherein said automation device comprises a front part set in between two side faces, said two side faces extend all the way to the front side of said enclosure.

14. An electric drive device cabinet installation, comprising:

an automation device, a bottom-to-top cooling airflow, and a blocking device located below the automation device, wherein an enclosure of said automation device includes a front side and at least one cockled side face, the at least one cockled side face including a multitude of curved heat sink fins along said cockled side face extending from a first end side of the enclosure to a second end side of the enclosure, said first end side and said second end side being neighboring end sides, said first end side joining said second end side, wherein each curved heat sink fin has:

a starting portion adjacent the first end side at which an angle of incidence a is measured between the inclination of the fin at the starting portion and a line parallel to the front side of the automation device; and a terminal portion adjacent the second end side at which a turning angle 3 is measured between the inclination of the fin at the terminal portion and a line parallel to the second end side of the automation device; and wherein the plurality of curved heat sink fins are arranged so that, when installed above said blocking device and exposed to said bottom to top cooling airflow in the cabinet, airflow is redirected from the front side toward the back of the enclosure to cool regions otherwise shadowed by the blocking device.

15. The electric drive device according to claim 14, wherein said electric drive device includes a frequency converter.

16. The automation device according to claim 2, wherein said multitude of curved heat sink fins are arranged on both cockled side faces of said enclosure.

17. The automation device according to claim 2, wherein said automation device is mounted to a DIN rail arranged in a cabinet back wall of the electric drive device cabinet installation.

18. The automation device according to claim 2, wherein said automation device is mounted to a cabinet back wall of the electric drive device cabinet installation.

19. The automation device according to claim 2, wherein the angle of incidence of said curved heat sink fins is between 0 degrees and 30 degrees.

20. The automation device according to claim 3, wherein said enclosure is made from aluminium, aluminium alloy, magnesium, copper, brass, plastic, polymer, polymer alloy, or synthetic resin.

* * * * *